United States Patent
Morrison et al.

(10) Patent No.: US 10,191,522 B2
(45) Date of Patent: Jan. 29, 2019

(54) DOCKING CONTROLLED ADAPTIVE HEATSINK

(71) Applicant: Dell Products, L.P., Round Rock, TX (US)

(72) Inventors: John Trevor Morrison, Round Rock, TX (US); Travis North, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/451,375

(22) Filed: Mar. 6, 2017

(65) Prior Publication Data
US 2018/0253125 A1 Sep. 6, 2018

(51) Int. Cl.
*H05K 7/20* (2006.01)
*G06F 1/20* (2006.01)

(52) U.S. Cl.
CPC .............. *G06F 1/203* (2013.01); *H05K 7/20* (2013.01)

(58) Field of Classification Search
None
See application file for complete search history.

(56) References Cited

U.S. PATENT DOCUMENTS

| | | | | |
|---|---|---|---|---|
| 5,640,302 A * | 6/1997 | Kikinis | ............. | G06F 1/1616 361/679.26 |
| 6,084,769 A * | 7/2000 | Moore | ............. | G06F 1/203 165/104.33 |
| 6,094,347 A * | 7/2000 | Bhatia | ............. | G06F 1/203 165/104.33 |
| 7,048,038 B2 * | 5/2006 | Pokharna | ............. | G06F 1/1632 165/104.21 |
| 2004/0080909 A1 * | 4/2004 | Kitahara | ............. | G06F 1/1632 361/679.48 |
| 2004/0268005 A1 * | 12/2004 | Dickie | ............. | G06F 1/1616 710/303 |
| 2006/0236014 A1 * | 10/2006 | Yin | ............. | G06F 1/1616 710/303 |
| 2010/0250816 A1 * | 9/2010 | Collopy | ............. | G06F 1/1616 710/303 |
| 2011/0051359 A1 * | 3/2011 | Sween | ............. | G06F 1/203 361/679.48 |
| 2014/0092555 A1 * | 4/2014 | Hua | ............. | H05K 7/20136 361/695 |

(Continued)

*Primary Examiner* — Courtney Smith
(74) *Attorney, Agent, or Firm* — Fogarty LLP (57) ABSTRACT

Systems and methods are provided for cooling an IHS (Information Handling System) that may be docked in docking station. The IHS includes a docking plate exposed on the outer surface. When docked, the docking plate interfaces with a corresponding conductive element provided by the docking station in order to transfer heat from the IHS to the docking station. Within the IHS, an adaptive heatsink provides passive cooling to a processor of the IHS. When the IHS is docked, a portion of the adaptive heatsink contacts the docking plate and, via the conductive element of the docking station, completes a thermal pathway to auxiliary cooling systems provided by the docking station, thus allowing the IHS to supporting higher operating temperatures. When the IHS is undocked, the adaptive heatsink is separated from the docking plate by an air gap, thus limiting the transfer of heat to the docking plate and maintaining safe surface temperatures.

8 Claims, 10 Drawing Sheets

(56) References Cited

U.S. PATENT DOCUMENTS

2015/0124398 A1* 5/2015 Kirkpatrick ........ H05K 7/20136
361/679.48
2016/0274985 A1* 9/2016 Gupta ................... G06F 9/4856
2017/0076575 A1* 3/2017 Kunnathur Ragupathi ................
G08B 21/02

* cited by examiner

DOCKING CONTROLLED ADAPTIVE HEATSINK

FIELD

This disclosure relates generally to cooling of Information Handling Systems (IHSs), and more specifically, to the use of heatsinks for cooling internal components of an IHS.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Mobile IHSs are now common and continue to be adopted in new applications as the capabilities of mobile IHSs continue to mature. Higher performance mobile IHSs are desirable as they enable providing users with more powerful and faster applications. Faster processors, for instance, allow mobile IHSs to provide users with faster operations and allow mobile IHSs to run more demanding applications, such as games that have demanding graphics requirements. A limiting factor in providing users with more powerful mobile IHSs, such as by using faster processors, is the heat generated by the internal components of the mobile IHS. In general, using a faster processor requires generating more heat.

For mobile IHSs, a significant constraint is the requirement to maintain the outer surface of the IHS at a safe temperature that allows a user to handle all parts of the IHS without risk of injury. For larger mobile IHSs, such as laptops, fans or other active heat transfer devices are used to eject heated air from inside the enclosure of the IHS. Smaller IHSs, such as tablets and handhelds, are typically limited to passive heat transfer devices, such as heatsinks, and may be unable to provide sufficient cooling required for certain processors. Due at least in part to the inability to dissipate additional heat, designers of mobile IHs may underutilize available processors or choose slower processors for certain mobile IHSs. By doing so, safe surface temperatures may be maintained, but at the expense of underutilizing available processing capabilities.

SUMMARY

Various embodiments provide a cooling system for an IHS, the cooling system including a docking plate, wherein that docking plate is exposed on the outer surface of the IHS and wherein the docking plate interfaces with a docking station to transfer heat from the IHS to the docking station; and a heatsink providing passive cooling to a processor of the IHS. In a first mode, the heatsink is separated from the docking plate by an air gap. In a second mode, a portion of the heatsink is in direct contact with the docking plate.

In certain additional embodiments of the cooling system, the heatsink is switched from the first mode to the second mode in response to docking the IHS in the docking station. In certain additional embodiments of the cooling system, the docking plate interfaces with one or more conductive surfaces on the docking station to transfer heat from the IHS to the docking station. In certain additional embodiments of the cooling system, the heatsink comprises one or more fins and wherein, in the second mode, the docking plate is separated by an air gap from each of the one or more fins. In certain additional embodiments of the cooling system, the docking plate includes one or more channels that each provide an air gap between the docking plate and a fin of the heatsink. In certain additional embodiments of the cooling system, the heatsink is switched from the first mode to the second mode by depressing the docking plate in contact with the heatsink. In certain additional embodiments of the cooling system, the movement of the docking plate towards the heatsink is limited by one or more springs.

Various additional embodiments provide an additional cooling system including a docking station configured to dock an IHS, where the IHS includes a heatsink, a processor cooled by the heatsink; a docking plate, wherein that docking plate is exposed on the outer surface of the IHS and wherein the docking plate interfaces with the docking station to transfer heat from the IHS to the docking station. In a first mode, the heatsink is separated from the docking plate by an air gap, and in second mode, a portion of the heatsink is in direct contact with the docking plate.

In certain embodiments of the additional cooling system, the docking station comprising one or more conductive surfaces that are in contact with the docking plate in the second mode. In certain embodiments of the additional cooling system, the docking station further comprising one or more fans configured to draw heat from the one or more conductive surfaces. In certain embodiments of the additional cooling system, the docking station further comprising a mechanism allowing a user to request release of the docked IHS from the docking station. In certain embodiments of the additional cooling system, the docked IHS is not released from the docking station until the surface temperature of the docked IHS is below a safety threshold. In certain embodiments of the additional cooling system, the heatsink is switched from the first mode to the second mode by the one or more conductive surfaces depressing the docking plate in contact with the heatsink. In certain embodiments of the additional cooling system, the one or more conductive surfaces depress the docking plate as a result of docking of the IHS in the docking station.

Various additional embodiments provide a method, including detecting a request to release a docked IHS secured by a docking station; determining a surface temperature of the docked IHS; calculating a time required for the docked IHS to cool from the determined surface temperature to a safe handling temperature; if the calculated cooling time is less than a delay duration, releasing the docked IHS from the docking station after the expiration of the delay duration from the detected release request; and if the calculated cooling time is greater than the delay duration, determining an auxiliary cooling sequence to cool the surface temperature of the docked IHS prior to the expiration of the delay duration from the detected release request.

In various additional embodiments of the method, the request to release the docked IHS is received via a button provided by the docking station. In various additional embodiments of the method, the surface temperature is measured at a docking plate of the IHS, wherein the docking plate transfers heat from the docked IHS to the docking station. In various additional embodiments of the method, the auxiliary cooling sequence comprises increasing the speed of one or more cooling fans comprised within the docking station. In various additional embodiments of the method, the time required for the docked IHS to cool is calculated based on a thermal capacity of the IHS. In various additional embodiments of the method, the method further comprises releasing the IHS from the docking station after the completion of the determined cooling sequence.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIG. 2b is an illustration showing certain internal components of the mobile IHS of FIG. 2a.

FIG. 3a is an illustration of the back surface of a mobile IHS according to certain embodiments.

FIG. 3b is an illustration of a docking station configured according to certain embodiments to support the docking of the mobile IHS of FIG. 3a.

FIG. 4b is a magnified view of a portion of the adaptive heatsink of the undocked mobile IHS of FIG. 4a.

FIG. 5b is a magnified view of a portion of the adaptive heatsink of the docked mobile IHS of FIG. 5a.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Figure 1:
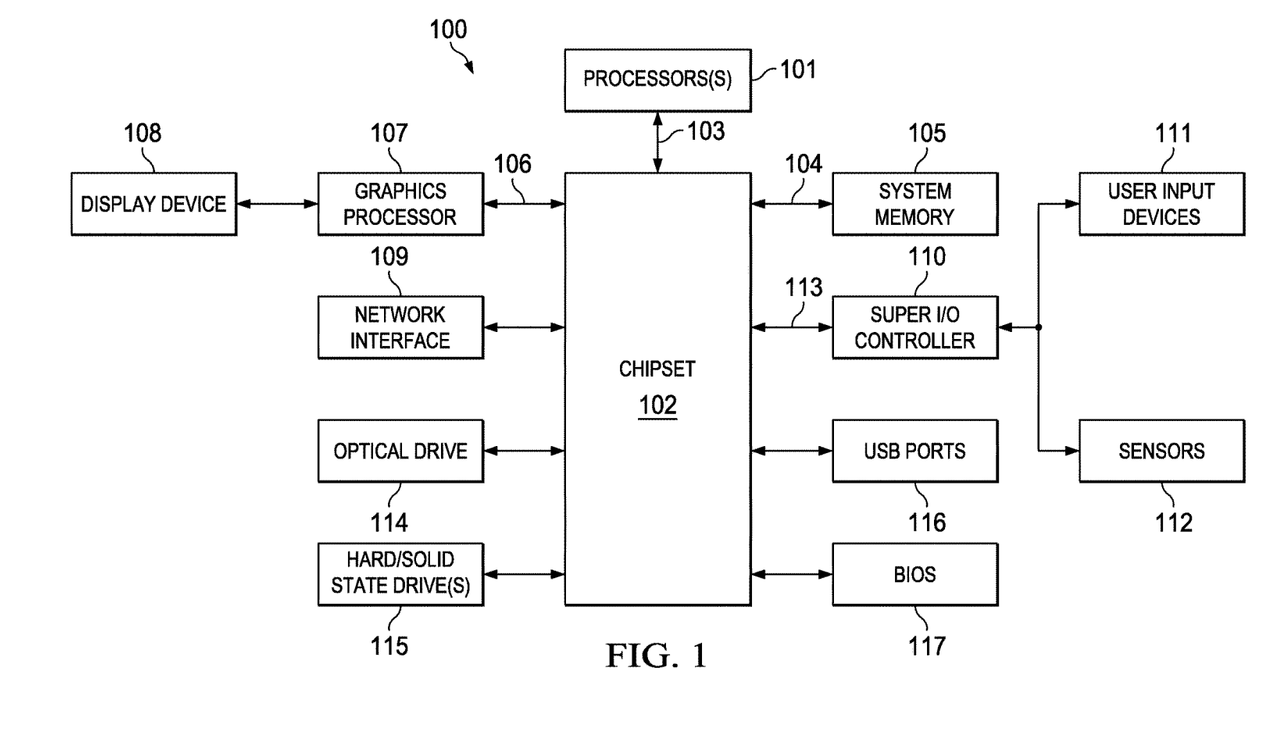
FIG. 1 is a block diagram depicting certain components of an IHS configured according to various embodiments.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. FIG. 1 shows various internal components of an example IHS configured to implement the provided embodiments. It should be appreciated that although certain embodiments described herein may be discussed in the context of a mobile IHS, such as a tablet or handheld device, other embodiments may be utilized with various other types of computing devices.

FIG. 1 is a block diagram of an IHS 100 configured according to certain embodiments. IHS 100 may include one or more processors 101. In various embodiments, IHS 100 may be a single-processor system including one processor 101, or a multi-processor system including two or more processors 101. Processor(s) 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

IHS 100 includes a chipset 102 that may include one or more integrated circuits that are connect to processor(s) 101. In certain embodiments, the chipset 102 may utilize a QPI (QuickPath Interconnect) bus 103 for communicating with the processor(s) 101. Chipset 102 provides the processor(s) 101 with access to a variety of resources. For instance, chipset 102 provides access to system memory 105 over memory bus 104. System memory 105 may be configured to store program instructions and/or data accessible by processors(s) 101. In various embodiments, system memory 105 may be implemented using any suitable memory technology, such as static RAM (SRAM), synchronous dynamic RAM (SDRAM), nonvolatile/Flash-type memory, or any other type of memory.

Chipset 102 may also provide access to a graphics processor 107. In certain embodiments, graphics processor 107 may be comprised within one or more video or graphics cards that have been installed as components of the IHS 100. Graphics processor 107 may be coupled to the chipset 102 via a graphics bus 106 such as provided by an AGP (Accelerated Graphics Port) bus, a PCIe (Peripheral Component Interconnect Express) bus. In certain embodiments, a graphics processor 107 generates display signals and provides them to a display device 108. In many embodiments, the display device 108 is integrated into the IHS in the form of a handheld or tablet device.

In certain embodiments, chipset 102 may also provide access to one or more user input devices 111. In such embodiments, chipset 102 may be coupled to a super I/O controller 110 that provides interfaces for a variety of user input devices 111, in particular lower bandwidth and low data rate devices. For instance, super I/O controller 110 may provide access to a keyboard and mouse or other peripheral input devices. In certain embodiments, super I/O controller 110 may be used to interface with coupled user input devices 111 such as keypads, biometric scanning devices, and voice or optical recognition devices. In certain embodiments, super I/O controller 110 may also provide an interface for communications with one or more sensor devices 112, which may include environment sensors, such as a temperature sensor or other cooling system sensors. The I/O devices, such as the user input devices 111 and the sensor devices 112, may interface super I/O controller 110 through wired or wireless connections. In certain embodiments, the super I/O controller 110 may be coupled to the super I/O controller 110 via a Low Pin Count (LPC) bus 113.

Other resources may also be coupled to the processor(s) 101 of the IHS 100 through the chipset 102. In certain embodiments, chipset 102 may be coupled to a network interface 109, such as provided by a Network Interface Controller (NIC) that is coupled to the IHS 100. In certain embodiments, the network interface 109 may be coupled to the chipset 102 via a PCIe bus. According to various embodiments, network interface 109 may support communication via various wired and/or wireless networks. Chipset 102 may also provide access to one or more hard disk and/or solid state drives 115. In certain embodiments, the chipset 102 may also provide access to one or more optical drives 114 or other removable-media drives. Any or all of the drive devices 114 and 115 may be integral to the IHS 100, or may be located remotely from the IHS 100. In certain embodiments, the chipset 102 may also provide access to one or more Universal Serial Bus (USB) ports 116.

Another resource that may be accessed by processor(s) 101 via chipset 102 is a BIOS (Basic Input/Output System) 117. Upon booting of the IHS 100, processor(s) 101 may utilize BIOS 117 instructions to initialize and test hardware components coupled to the IHS 100 and to load an Operating System (OS) for use by the IHS 100. The BIOS 117 provides an abstraction layer that allows the operating system to interface with certain hardware components that are utilized by IHS 100. Via this hardware abstraction layer provided by BIOS 117, the software executed by the processor(s) 101 of IHS 100 is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2A:
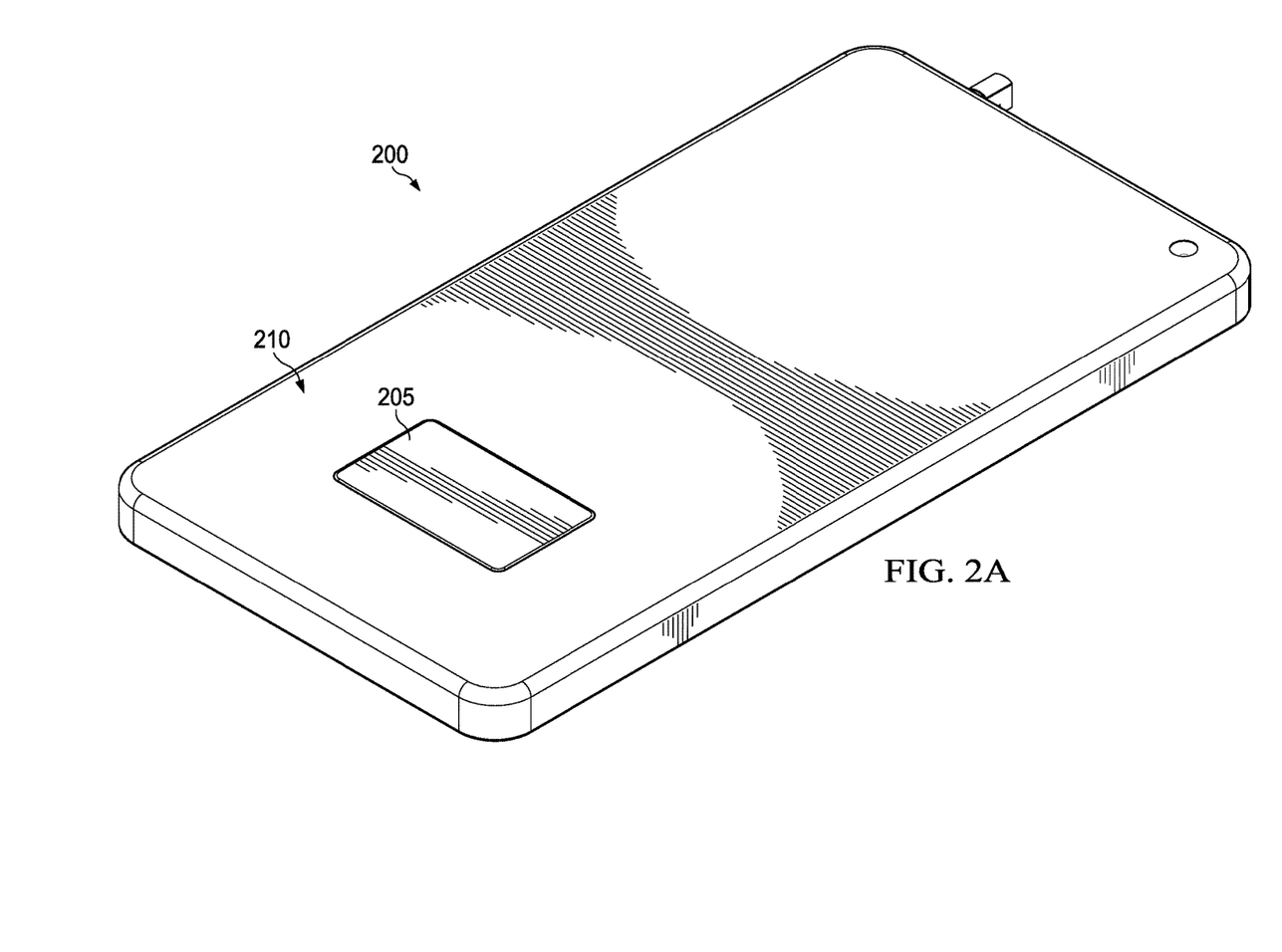
FIG. 2a is an illustration of the back surface of a mobile IHS according to certain embodiments.

FIG. 2a is an illustration of the back of a mobile IHS 200 according to various embodiments. The back cover 210 of the mobile IHS 200 includes a docking plate 205. The back cover 210 of the mobile IHS 200 may be an integral or removable portion of the enclosure that forms the non-display portion of the outer surface of the mobile IHS 200. The back cover 210 may be formed from any material suitable for use as an enclosure of an IHS. The back surface of the 210 includes an opening in which the docking plate 205 is located. The docking plate 205 may be constructed of any metallic material or other material suitable for transfer of energy, in particular suitable for the indirect transfer of heat from inside the mobile IHS 200. While the mobile IHS 200 is not docked, the docking plate 205 may allow a certain amount of heat from inside the mobile IHS 200 to dissipate, and thus provide some cooling. However, as described with regard to the below embodiments, the docking plate 205 is not in contact with the internal cooling components of the mobile IHS 200 while the mobile IHS 200 is not docked.

Figure 2B:
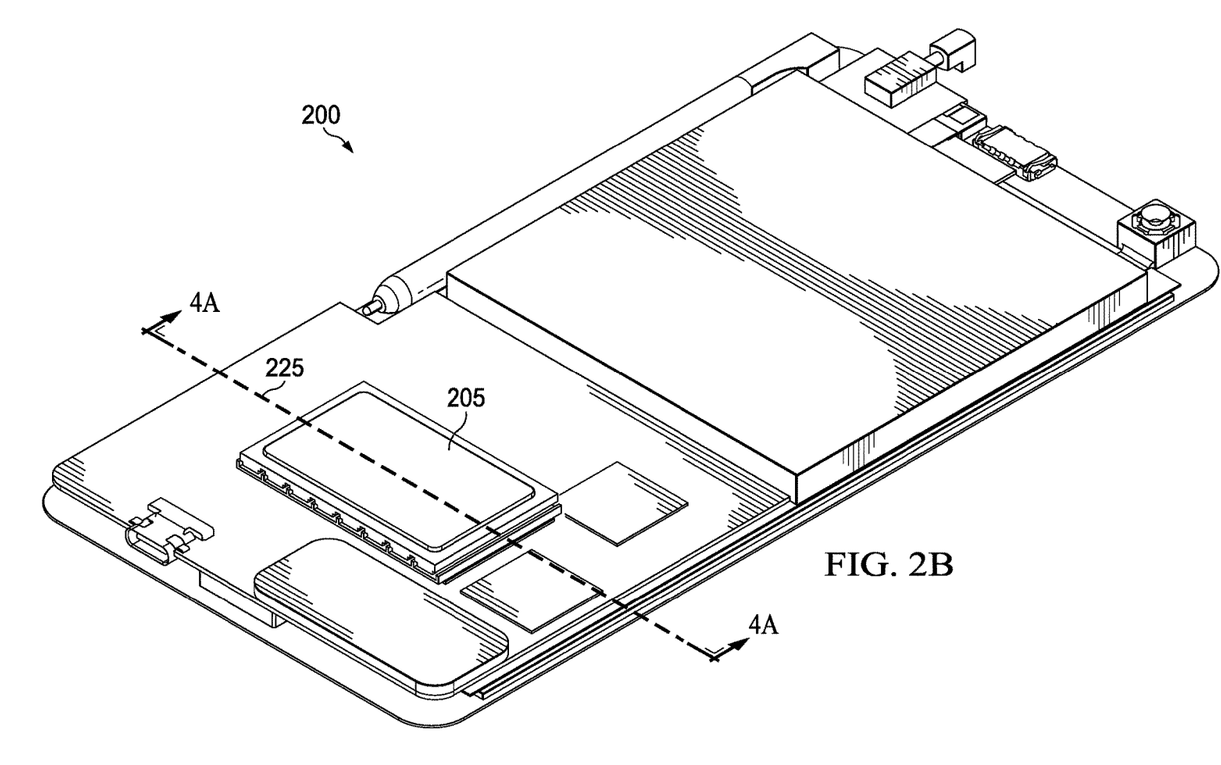

FIG. 2b is an illustration of the mobile IHS of FIG. 2a where the back cover 210 has been removed to reveal certain of the internal components of the mobile IHS. In FIG. 2b, the docking plate 205 is shown separate from the back cover 210. In certain embodiments, the docking plate 205 may be a permanently secured portion of the back cover 210 such that the docking plate 205 may not separable from the back cover 210 as shown in FIG. 2b. The removal of the back cover 210 in FIG. 2b illustrates the alignment of the docking plate 205 with the internal components of the mobile IHS. 200.

Figure 2C:
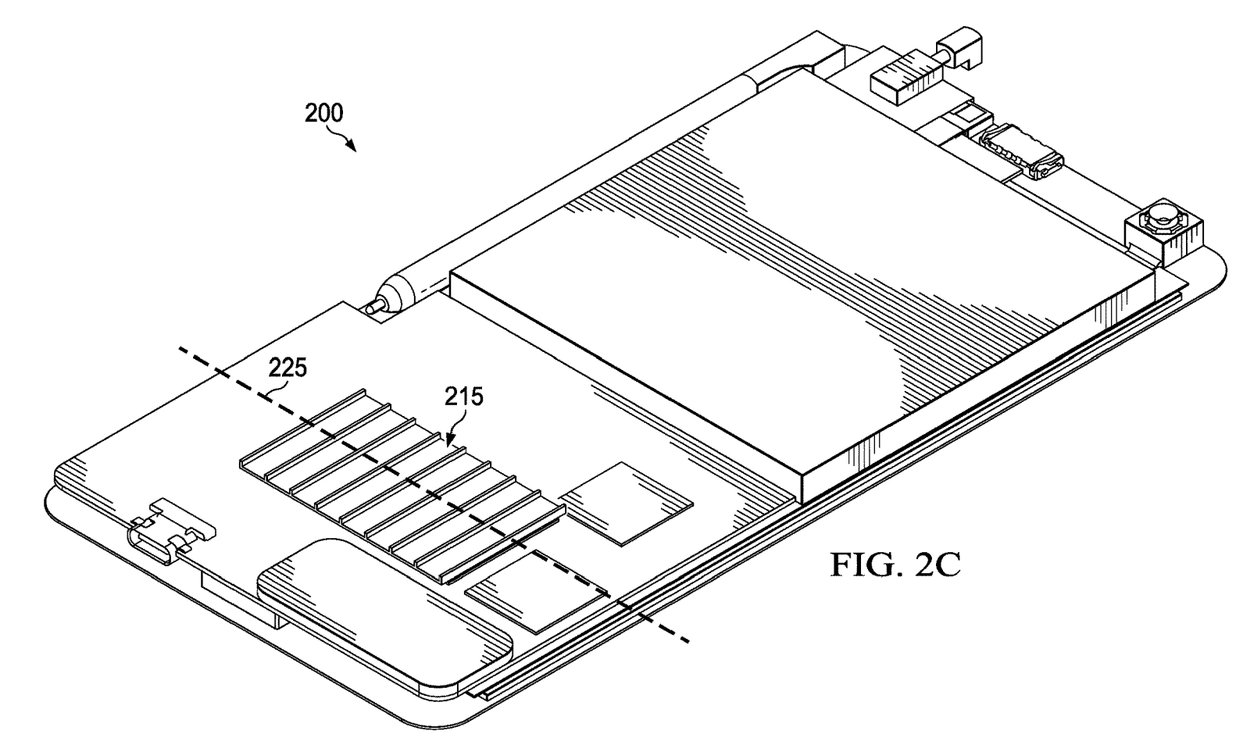
FIG. 2c is an illustration showing certain additional internal components of the mobile IHS of FIGS. 2a-b.

FIG. 2c is an illustration showing additional internal components of the mobile IHS 200 of FIGS. 2a-b. In FIG. 2c, the back cover 210 is removed, including the docking plate 205 shown separately in FIG. 2b. As illustrated in FIGS. 2b-c, the docking plate 205 is position over a heatsink 215 of the mobile IHS 200. As described in more detail with respect to the below embodiments, depending on whether the mobile IHS 200 is docked, an air gap may be maintained between the docking plate 205 and the heatsink 215 or the docking plate 205 may directly contact the heatsink 215. The location of the docking plate 205 within the back cover 210 may be selected in order to align the docking plate 205 over the heatsink 215 of the mobile IHS 200. In certain embodiments, the docking plate 205 may have a larger area than the heatsink 215, such as illustrated in FIG. 2b, in which the entire heatsink 215 is obscured by the docking plate 205. In certain other embodiments, the docking plate 205 may have a smaller area than the heatsink 215, and thus may not obscure the entire heatsink from view, such as in FIG. 2b.

Figure 2D:
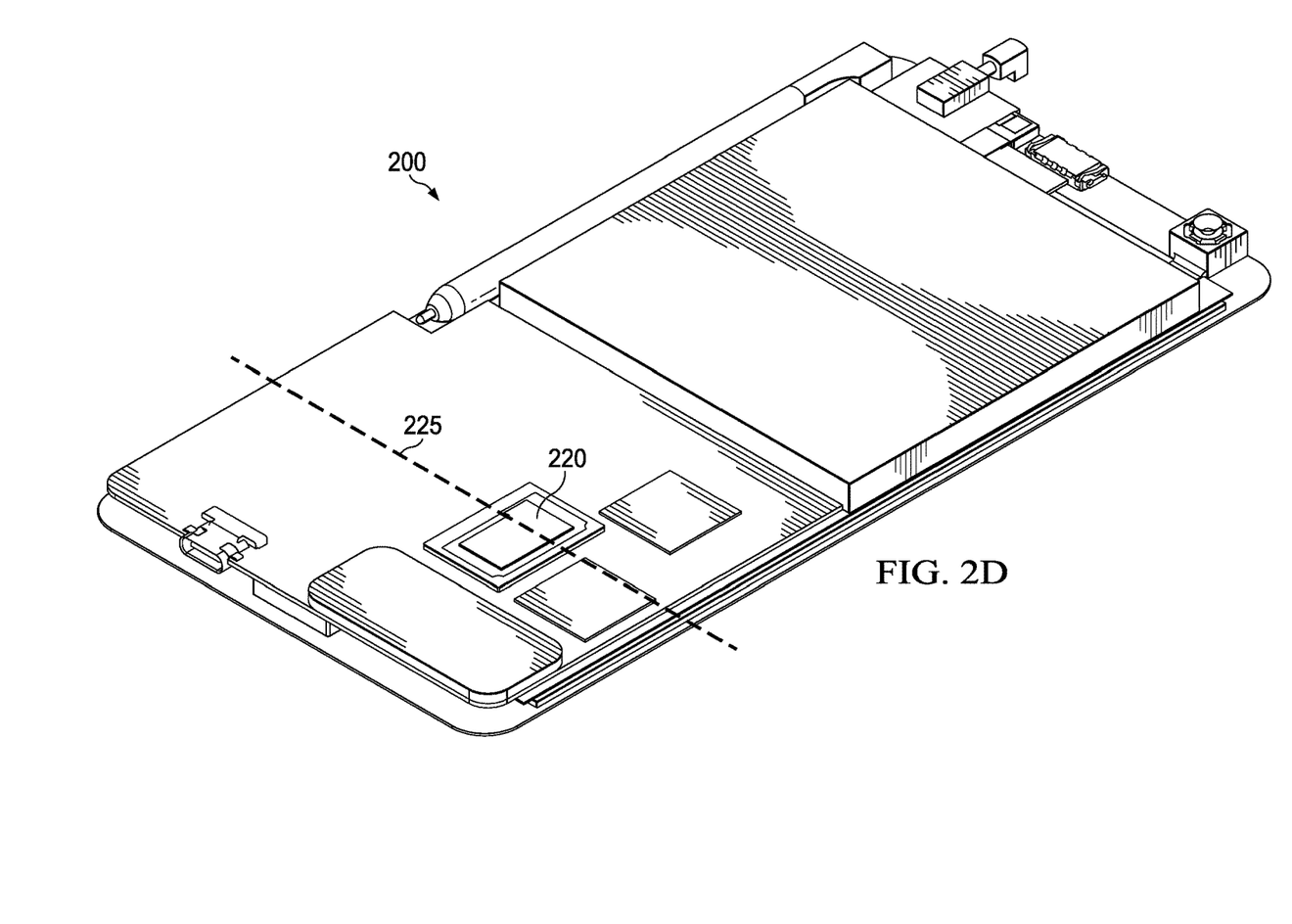
FIG. 2d is an illustration showing certain additional internal components of the mobile IHS of FIGS. 2a-c.

FIG. 2d is an illustration of the mobile IHS 200 of FIGS. 2a-c, where the heatsink 215 has been removed to reveal a processor 220 of the mobile IHS. The heatsink 215 transfers heat from the processor 220 and dissipates the transferred heat, thus serving to cool the processor 220. As described with respect to the embodiment of FIG. 1, an IHS may include a general-purpose processor capable of executing program instructions, such as the program instructions that may include instructions for operating the operation system, application programs and hardware level interfaces used by the IHS. In certain embodiments, the processor 220 of FIG. 2d that is cooled by heatsink 215 may be a general-purpose processor of the mobile IHS. In other embodiments, the processor 220 cooled by the heatsink 215 may be a graphics processor, specialized system-on-chip, microcontroller or any other processing component that may utilize a heatsink for cooling.

Figures 3A, 3B:
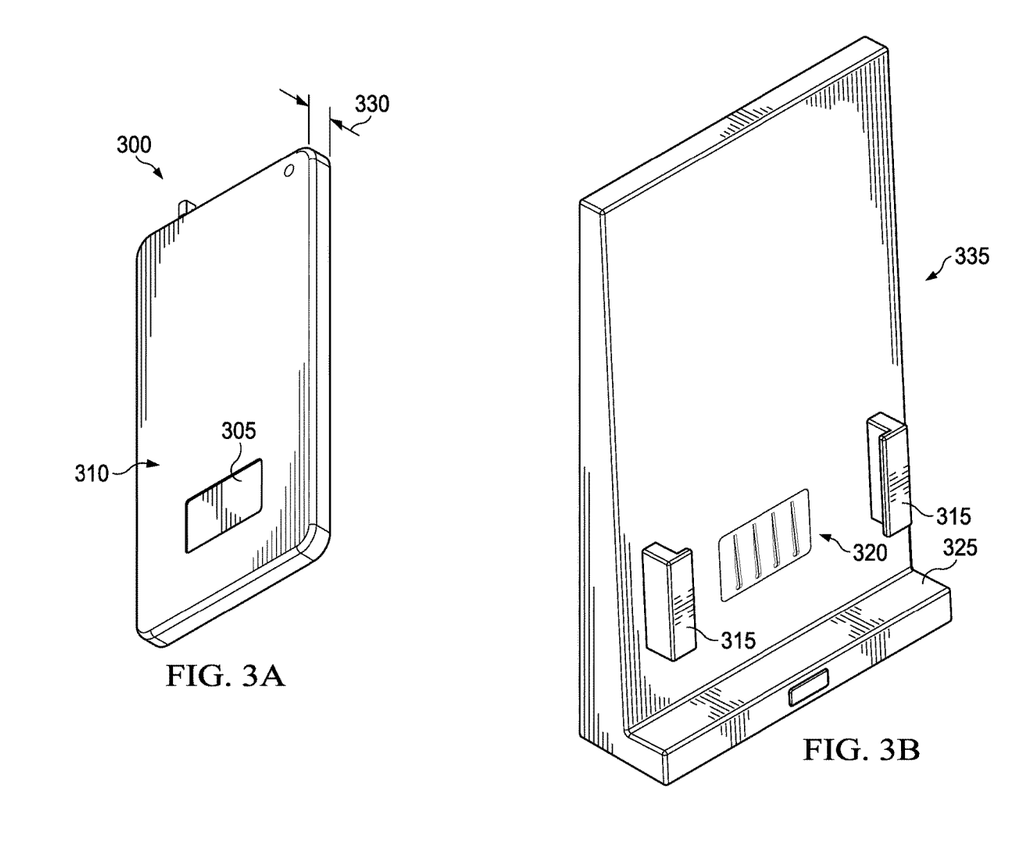

FIG. 3a is an illustration of the back of a mobile IHS 300 according to certain embodiments. As described with respect to the embodiment of FIGS. 2a-d, the back cover 310 of the mobile IHS 300 includes a docking plate 305 that is positioned such that it may contact an internal heatsink that provides cooling to a processor of the mobile IHS 300. FIG. 3a additionally illustrates the thickness 330 of the mobile IHS 300. This thickness 330 may be the advertised thickness of the mobile IHS 300 or may be the actual thickness of the long edges of the mobile IHS 300. The thickness 300 of the long edges of a mobile IHS 300 according to various embodiment may allow the mobile IHS to be docked in a docking station 335, such as illustrated in FIG. 3b.

The docking station 335 provides a cradle in which the mobile IHS 300 may be temporarily secured. In certain embodiments, the docking station 335 may provide an interface for charging of the docked mobile IHS 300. Certain embodiments of the docking station 335 may include wired communication interfaces through which the mobile IHS 300 may access network resources, output to an external display, and/or connect to local resources such as a USB hub provided by the docking station 335. As illustrated in FIG. 3b, a docking station 335 according to various embodiments includes a set of conductive elements 320 for providing cooling to the docked mobile IHS.

In the illustrated embodiment, the docking station 335 includes four conductive elements 320. Other embodiments of the docking station 335d may utilize different numbers of conductive elements or may utilize different configurations of the conductive elements. For instance, embodiments of the docking station 335 may utilize a single, rectangular conductive element. Similar to the docking plate 305 described with respect to FIGS. 2a-d, the conductive elements 320 may be constructed of any metallic or other material that is suitable for conducting heat. The conductive elements 320 are located on the docking station 335 such that the conductive elements 320 are in contact with the docking plate 205 of the mobile IHS 300 when docked in the docking station 335.

In certain embodiments, the conductive elements 320 protrude from the docking surface of the docking station 335. In certain of such embodiments, the conductive elements 320 may additionally be spring loaded, thus allowing the conductive elements 320 to be depressed by the docking of the mobile IHS. As described with regard to the following embodiments, the docking plate 305 may itself be spring loaded such that it may displaced to contact the internal heatsink of the mobile IHS when docked, but to otherwise maintain an air gap between the docking plate 305 and the heatsink when not docked. In such embodiments, the springs of the conductive elements 320 may be selected to have a greater resistive force than the compressive force used by the springs the docking plate 305. In certain embodiments, using springs in this manner may allow the conductive elements 320 to push the docking plate 305 in contact with the heatsink when the mobile IHS 300 is docked.

The docking station 335 illustrated in FIG. 3b include two guides 315 that may be used to secure the mobile IHS 300 to the docking station 335. The thickness 330 of the mobile IHS 300 corresponds with the guides 315 in order for the docking station 335 to securely retain the mobile IHS while docked. The thickness 330 of the mobile IHS allows a user to slide the mobile IHS 300 behind the guides 315 until the mobile IHS 300 rests on a cradle 325 of the docking station 335. The guides 315 allow the mobile IHS 300 to be slid in and out of the support cradle 325, but also limits the movement of back cover 310 of the mobile IHS 300 away from the surface of the docking station 335. In certain embodiments, this retaining force provided by the guides 315 prevents the docked mobile IHS 300 from being displaced by the resistive force of the springs that cause the conductive elements 320 to protrude from the docking surface and against the docking plate. This retaining force of the guides 315 secures the docked mobile IHS 300 and allows the conductive elements 320 to displace the docking plate 305 of the mobile IHS 300 such that in comes in contact with the heatsink, as described in additional detail with respect to the below embodiments.

In certain embodiments, docking station 335 may include an active cooling system, such as fans, that are configured to draw heat from the conductive elements 320 and thus also drawing heat from the docking plate 305 of the docked mobile IHS 300. In other embodiments, docking station 335 may utilize passive cooling elements, such as heatsinks, to dissipate heat from the conductive elements 320. Certain embodiments of the docking station 335 may utilize combinations of active and passive cooling element to dissipate heat from the conductive elements 320. In certain such embodiments, the docking station 335 may include one or temperature sensors that determine a temperature of the docked mobile IHS 300 and activate different cooling elements based on the measured temperatures. For instance, the docking station 335 may include sensors to measure the surface temperature of the back cover 310 of the docked mobile IHS 300. The docking station 335 may instead receive temperature information directly from the docked mobile IHS 300 via a wired connection interface provided by the docking station 335 or via a wireless communication interface.

Figure 4A:
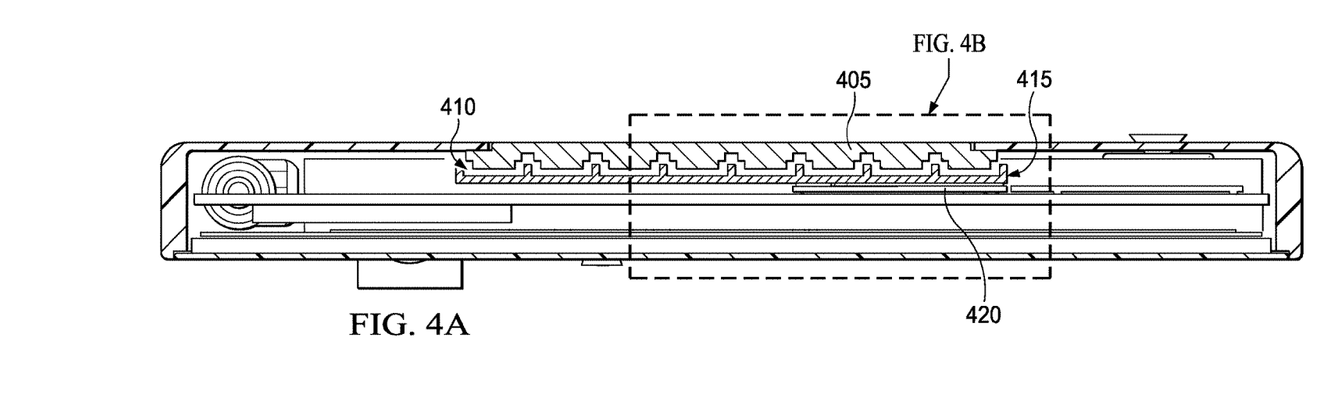
FIG. 4a is a cutaway illustration of an undocked mobile IHS utilizing an adaptive heatsink according to various embodiments.

FIG. 4a is a cutaway illustration of certain components of an IHS such as the mobile IHS 200 and 300 described with respect to the embodiments of FIGS. 2a-d and 3a-b. The IHS of FIG. 4a utilizes an adaptive heatsink 415 according to various embodiments that provides direct transfer of heat to a docking station when the IHS is docked, and that dissipates heat to the surrounding air when the IHS is not docked. FIG. 4a is a cross-section of an IHS that illustrates the operation of an adaptive heatsink while the IHS is not docked. In such scenarios, the user may be holding the IHS, the IHS may be resting on a surface, the IHS may be positioned using a stand, such as a kickstand, or the IHS may be in any other non-docked position. In all such cases, the user may handle the IHS, such that surface temperatures of the IHS must be maintained at safe levels. When docked, the adaptive heatsink 415 and docking plate 405 provide augmented cooling. When not docked, that adaptive heatsink 415 is separated from the docking plate 405 by an insulating layer 410 that prevents the direct transfer of heat from the adaptive heatsink 415 to the surface of the undocked IHS.

The illustrated cross-section is taken on a plane that intersect with the processor 420, heatsink 415, and docking plate 405 of the IHS. For instance, the cross-section of FIG. 4a may be taken at plane 225 shown with respect to the mobile IHS 200 of FIGS. 2a-d. As shown in FIG. 4a and in more detail in the magnified view provided by FIG. 4b, when the IHS is in undocked position, the docking plate 405 is separated from the heat skin 415 by an insulating air gap 410. In this configuration, the heatsink 415 continues to provide passive cooling of the IHS processor 420 by drawing heat from the processor 420 and dissipating the heat by transferring it to the surrounding air. As illustrated, in certain embodiments, the heatsink 415 may include one or more fins 425 that increase the surface area of the heatsink 415, thus improving the rate at which the heatsink is able to transfer heat to the surrounding air. When the device is not docked, the air gap 410 is maintained between the docking plate 405 and all portions of the heatsink 415, including the fins 425 that protrude from the body of the heatsink 415.

Figure 4B:
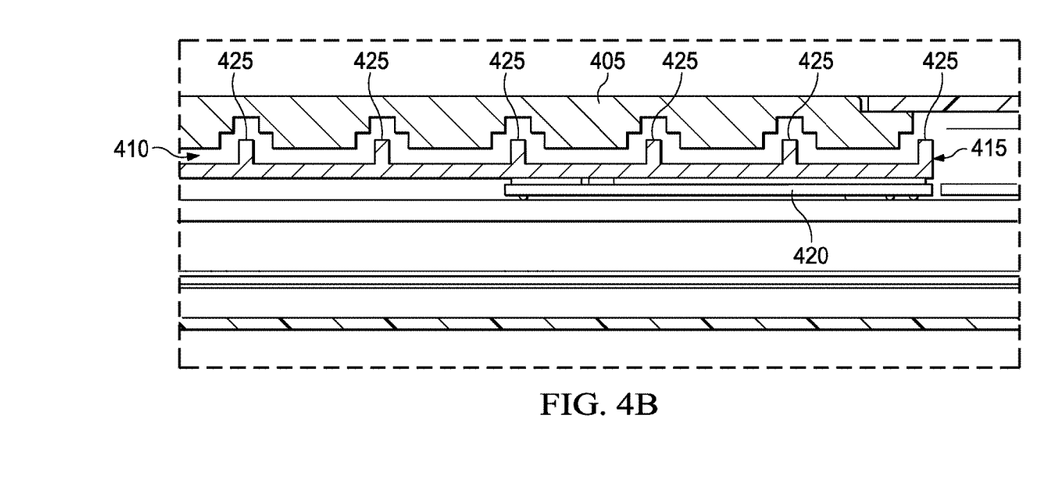

By maintaining the air gap 410 between the docking plate 405 and the heatsink 415, unsafe transfer of heat to the docking plate 405 is prevented. As described with respect to FIGS. 5a-b, when the IHS is docked the docking plate 405 and the heatsink 415 are in direct contact, thus allowing heat to be transferred to the dock, via contact between the docking plate 405 and heat transfer surfaces provided by the dock and improving the ability to cool the IHS. In the configuration of FIGS. 4a-b, the IHS is not docked, such that the user can be expected to touch any portion of the enclosure of the IHS at any time, including the docking plate 405 that is exposed on the back cover of the IHS. Accordingly, the IHS must maintain safe surface temperatures.

The air gap 410 insulates the docking plate 405 from the heatsink 415, which greatly moderates the transfer of heat to the docking plate 405 when compared to the transfer of heat between the docking plate 405 and heatsink 415 when these components are in direct contact. Even when undocked and the air gap 410 is maintained, a certain amount of heat may radiate from the heatsink 415 and be absorbed by the docking plate 405, such that the docking plate 405 does experience a certain amount of heating while the IHS is undocked. The insulating properties of the air gap 410 limit the amount of heat that can be transferred in this manner, such that safe surface temperatures are not exceeded.

In certain embodiments, the movement of the docking plate 405 may be limited by one or more springs. For instance, the IHS may include a set of springs that must be compressed in order to push the docking plate 405 in contact with the heatsink 415. When the IHS is not docked, safe handling temperatures must be maintained. Springs resisting the movement of the docking plate 405 towards the heatsink 415 reduce the risk of the user accidentally depressing the docking plate 405 such that it comes in contact with the heatsink 415, thus potentially heating up the docking plate 405 to unsafe temperature in a short amount of time. The springs utilized in this manner may be selected to reduce the risk of a user accidentally completing the thermal pathway to the processor of the IHS, but still allow a structure such as the conductive elements of FIG. 3b or the docking plate of FIG. 5b, to exert sufficient force to compress the spring and allow direct heat transfer to the docking station.

Figure 5A:
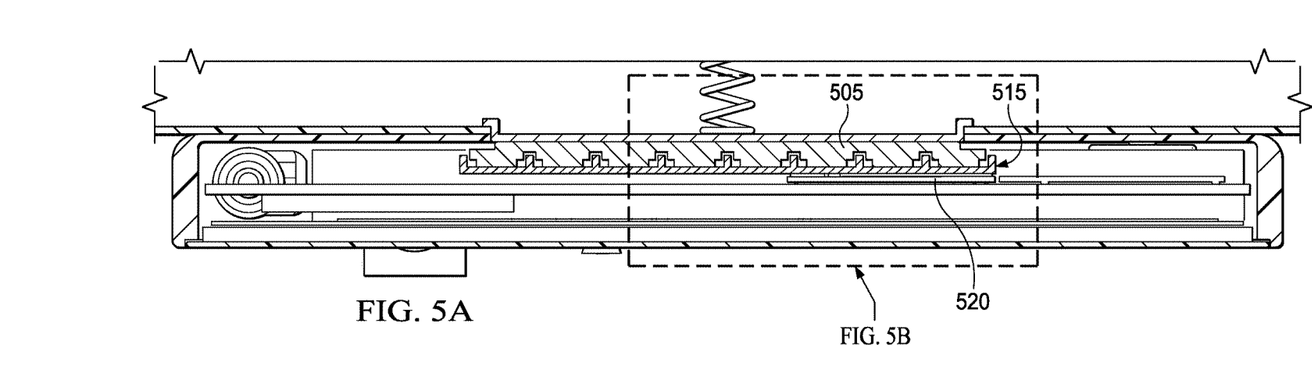
FIG. 5a is a cutaway illustration of a docked mobile IHS utilizing an adaptive heatsink according to various embodiments.
Figure 5B:
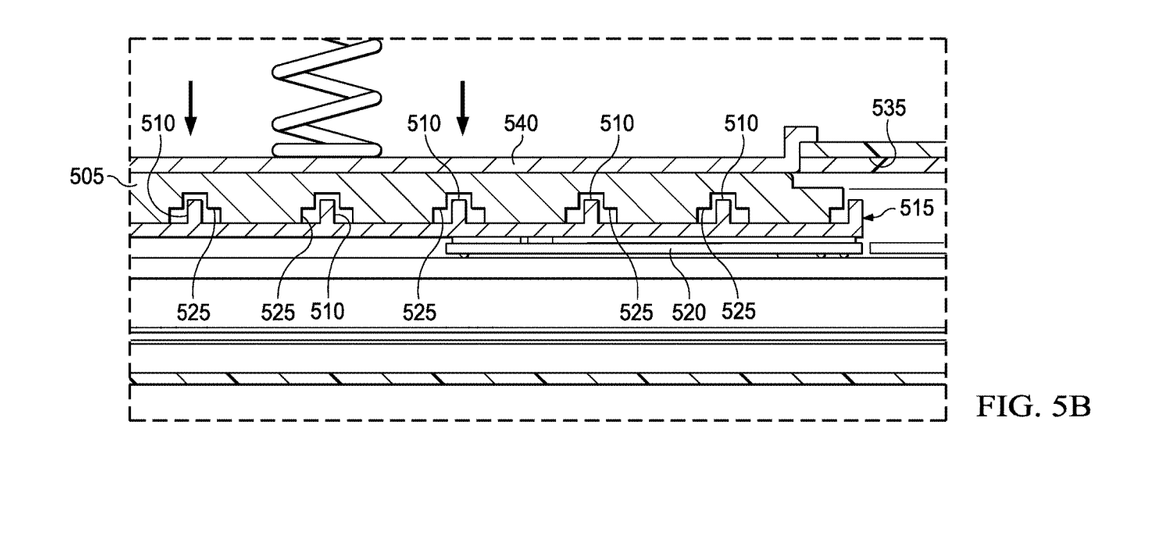

FIGS. 5a-b are cutaway illustrations of an IHS utilizing an adaptive heatsink according to various embodiments, where the IHS is in a docked position. In particular, FIGS. 5a-b are illustrations of the IHS of FIGS. 4a-b. In the docked position of FIGS. 5a-b, the back surface of the IHS rests against the docking surface 535 of the docking station, such as described with respect to FIG. 3b. In the docked position illustrated in FIGS. 5a-b, the IHS may rest on the cradle of the dock and may be held in a docked position using guides, such as described above. While the IHS is secured in the docked position, the back surface of the IHS is not accessible by the user. In particular, the user cannot touch the docking plate 505 that is exposed on the back cover of the IHS.

As illustrated, when the IHS is docked, the docking plate 505 is now in direct contact with the heatsink 515. Accordingly, the heatsink 515 draws heat from the processor 520 and directly transfers a portion of the heat to the docking plate 505. The docking plate 505, in turn, may be in direct contact with structures of the dock, such as the conductive elements described with respect to FIG. 3b, to which the heat can be transferred from the IHS to the dock. As described, the dock may include combinations of active and passive cooling elements, such as a fan, that can be used to provide substantial amounts of cooling to the processor of the IHS via the direct heat transfer pathway created by the heatsink 515 contacting the docking plate 505.

As shown in FIG. 5a and in more detail in the magnified view provided by FIG. 5b, when the IHS is in docked position, no air gap is present between portions of the docking plate 505 and the heatsink 515 such that these components are in direct contact. In certain embodiments, the docking plate 505 may include channels 525 that accommodate the fins 510 of the heatsink 520, such that an air gap is maintained around each of the fins 510 even though the IHS is docked and portions of the docking plate 505 are in direct contact with the heatsink 515. The channels 525 may be shaped to accommodate the fins 510 in order to protect the fins 510 from damage by the movement of the docking plate 505 as the IHS is docked and undocked. In certain embodiments, the channels 525 of the docking plate 505 may be shaped in the illustrated stair-stepped pattern. Such a configuration provides additional clearance between the docking plate 505 and the fins 510 while the docking plate 505 is being moved past the distal edges of the fins 510 as they are lowered and raised from the body of the heatsink 515, thus providing greater tolerances for the initial movement of the docking plate 505 towards the heatsink 515. This configuration also accommodates tighter clearances, and smaller air gaps, between the docking plate 505 and the distal ends of the fins 510 as the docking plate 505 gets closer to contacting the body of the heatsink 515.

Is illustrated in the magnified view of FIG. 5b, in certain embodiments the docking surface 535 of the dock may include a pressure plate 540 that exerts force, as indicated by the arrows, on the docking plate 505 of the IHS. In certain embodiments, the pressure plate 540 may be mechanically actuated by the dock in response to the detecting the IHS is securely docked. In certain embodiments, the pressure plate 540 may be attached to one or more springs that compress to allow the pressure plate 540 to be depressed until it is flush with the main portion of the docking surface 535, thus allowing the IHS to slide past while being docked and undocked. Once the IHS is docked, the resistive force of the pressure plate 540 springs push the pressure plate 540 against the back surface of the IHS. As described with respect to the conductive surfaces of FIG. 3b, these pressure plate 540 may be configured in various embodiment to align with the docking plate 505 of the docked IHS. In such configurations, the springs push the pressure plate 540 against the docking plate 505 until it contacts portions of the heatsink 515 directly as illustrated.

As described, the travel of the docking plate 505 relative to the heatsink 515 may be restricted using springs, in order to limit the potential for unsafe heating of the docking plate 505 while the IHS is undocked. In such embodiments, the springs of the pressure plate 540 may be selected to provide sufficient force to compress the springs of the docking plate 505 and push the docking plate 505 in contact with the heatsink 515 when the IHS is docked. In certain embodiments, the back cover of the enclosure of the IHS may also deflect inwards, such that the application of force by the pressure plate 540 provides the docking plate 505 with additional travel and decreasing the amount of force required to push the docking plate 505 in contact with the heatsink 515. In certain embodiments, the pressure plate 540 may be formed from a conductive surface, such as the described with respect to the conductive elements of the docking station of FIG. 3b. In certain embodiments, only portions of the pressure plate 540 may be formed from conductive surfaces.

Figure 6:
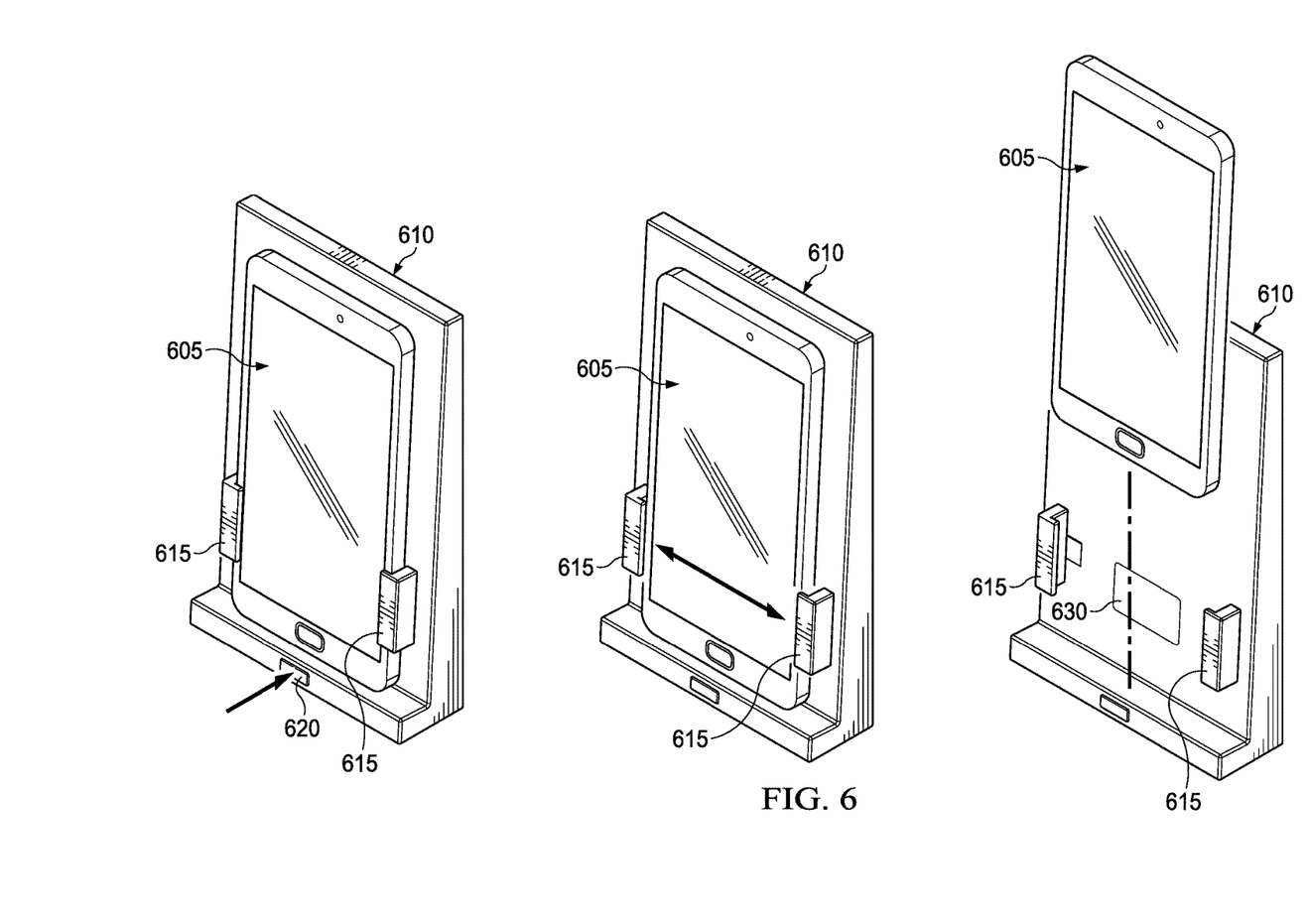
FIG. 6 is a series of three illustrations of an IHS being released from a docked configuration according to various embodiments.

FIG. 6 is a series of three illustrations depicting the controlled release of a docked IHS according to certain embodiments. As described, when docked, heat is transferred directly from an adaptive heatsink to the docking plate exposed on the back surface of the IHS. When docked, the docking plate is in contact with conductive surfaces provided by the dock in order to transfer heat directly from the IHS to the docking station. Due to this heat transfer in a docked configuration, the temperature of the docking plate may exceed safe handling temperatures. As such, if the user undocks the device while heat is being transferred, the docking plate may be at an unsafe temperature for the user to touch. FIG. 6 illustrates three aspects of a process, described in the flowchart of FIG. 7, by which the undocking of an IHS 605 may be delayed until the docking plate is at a safe handling temperature.

Similar to the dock of FIG. 3*b*, docking station 610 provides a cradle in which an IHS 605 may be temporarily secured. As with the dock of FIG. 3*b*, the docking station 610 may provide interfaces for charging and communication with the docked IHS 605. The docking surface of the docking station 610 includes a conductive element 630 for providing cooling to the docked IHS 605. As described, when the IHS 605 is docked, a docking plate and an adaptive heatsink are pushed in direct contact, thus completing a pathway of direct heat exchange between the processor of the IHS 605 and the dock 610. When docked, the exposed docking plate is in contact with a conductive element 630 provided by the docking station 310, where the conductive element 630 allows heat to be transferred directly from the docking plate to the docking station.

In the illustrated embodiment, the conductive element 630 is a rectangular area that is aligned with the docking plate of the docked IHS 605. As described, in certain embodiments, the conductive element 630 may exert a force on the docking plate, for instance by loading the conductive element 630 with springs, in order to push the docking plate in contact with the adaptive heatsink and complete the thermal pathway from the processor to the docking station. The docking station 610 may include combinations of active and passive cooling elements, such as one or more fans, that may be used to provide auxiliary cooling to the docked IHS via the created direct heat transfer pathway.

As with the dock in FIG. 3*b*, the docking station 610 include two guides 615 that are used to secure the IHS 605 to the docking station 610. The guides 615 of FIG. 6 may be mechanically actuated in order to prevent the IHS 605 from being undocked while surface temperatures of the docked IHS 605 are unsafe. One such scenario is illustrated with respect the process according to various embodiments of FIG. 7. The process of FIG. 7 may begin in certain embodiments at step 705 with the user requesting that the docked IHS 605 be released from the docking station 610. In the illustrated embodiment, the user may request undocking of the IHS by pressing button 620 provided by the docking station 610. Other embodiment may utilize other or additional mechanisms for allowing a user to signal a request to undock the IHS, such as via a software interface provided to the user via the running, docked IHS.

Figure 7:
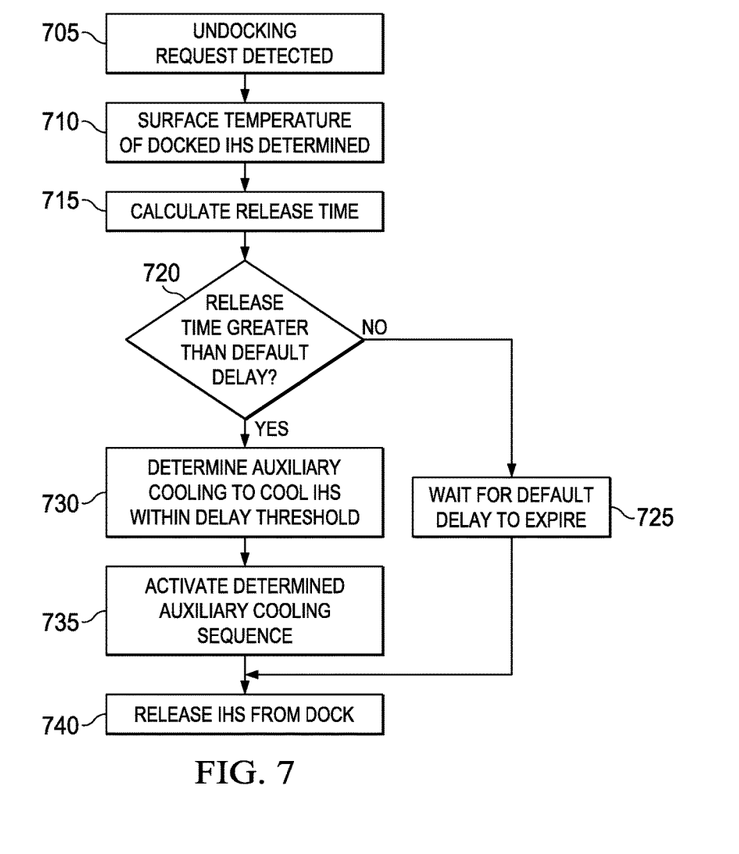
FIG. 7 is a flowchart describing certain step of a process according to certain embodiments for delaying the release of a docked IHS.

The docking station 610 does not release the docked IHS immediately in response to the user pressing button 620. At step 710, the surface temperature of the docked IHS is determined. This surface temperature may be calculated based on one or more sensors that may be provided by the docked IHS 605 and/or the docking station 610. The calculated surface temperature may include direct and indirect surface temperature measurements. In certain embodiments, the temperature calculation may be based strictly on the measured temperature of the docking plate. At step 715, the time required for the docked IHS 605, more specifically for the docking plate of the docked IHS, to cool to a safe handling temperature is calculated. In certain embodiments, this cooling time required for a safe release is calculated based on parameters that may include the measured temperature of the IHS, the current cooling rate provided via the direct heat transfer pathway from the IHS 605 processor to the cooling system provided by the dock station 610, the ambient temperature and the thermal capacity of the IHS 605, which indicates the IHS's tendency to retain heat once a heating source is removed.

In certain embodiments, the docking station 610 is configured to retain the docked IHS 605 until the surface temperature of the IHS, in particular the exposed portion of the docking plate of the IHS, has dropped to a safe temperature for handling by a user. In such embodiments, the guides 615 and 625 may be actuated to secure and release the IHS 605 from the docking station 610. For instance, in the leftmost diagram of FIG. 6, the guides 615 secure the docked IHS 605 to the docking station 610. In the center diagram of FIG. 6, the guides 615 are now shown in a position that allows the IHS 605 to be removed from the dock 610. In the illustrated embodiment, the guides 615 are clamps that can be actuated to secure the IHS 605 in place or may be re-positioned or otherwise loosened so that the IHS 605 can be removed.

In embodiments utilizing such mechanisms to secure the IHS 605, the docking station 610 may be configured to delay release of the IHS 605 for a pre-defined duration. Referring back to the process of FIG. 7, at step 720, the calculated time required to cool the IHS to safe handing temperature is compared against a configurable delay implemented by the docking station 610. This delay is a default amount of time the IHS 605 will be retained by the docking station 610 after a user requests for release the IHS 605 from the docking station has been detected. For instance, the docking station 610 may be configured to implement a three second delay from receiving a release request before releasing the docked IHS 605.

If the calculated time required to cool the IHS is less than the default delay time, at step 725, the docking station 610 waits for this delay time to expire. At the end of the delay, the IHS has reached a safe handing temperature, as step 740 the IHS 605 is released from the docking station 610. In certain embodiments, the docking station 610 actuates the guides 615 to a release position that allows the IHS 605 to be undocked by the user. Other embodiments may utilize various different mechanisms for securing the IHS to the docking station. Even though the docked IHS 605 could be safely released from the docking station 610 as soon as sufficient cooling of the docking plate has been detected, the embodiment of FIG. 7 delays release of the IHS 605 until the expiration of the default delay. In certain embodiments that enforce a default delay, certain exceptions may allow immediate release of the IHS from the docking station, such as if the docked IHS is currently off or in standby mode, or based on various other conditions. In certain scenarios, enforcing the default delay may result in the IHS being retained longer than the time required for the IHS to cool to a safe handling temperature. The benefits of providing the user with a consistent experience outweighs any unnecessary wait times that may be experienced by the user. For instance, if the docking station 610 implements a three second release delay in response to the user pressing the release button 620, the user will learn to incorporate this delay into the regular workflows. Releasing the IHS from the docking station as soon as the IHS has cooled may avoid certain unnecessary cooling delays, but may result in user frustration due to perceived inconsistent behavior by the docking station.

If, at step 720, the time required to cool the docked IHS 605 to a safe handling temperature is determined to be greater than the default delay implemented by the docking station 610, at step 730, the auxiliary cooling required to cool the IHS to safe handling temperature is determined. As described, the docking station 610 may include various combinations of cooling elements, such as fans and heatsinks, which can be used to draw heat from the docked IHS via the thermal pathway created by the direct contact between the adaptive heatsink and the docking plate of the docked IHS. At step 730, a sequence of auxiliary cooling steps are determined, where this sequence allows the auxiliary cooling system of the docking station 610 to draw the surface temperature of the docked IHS to safe levels within the default delay time. In certain embodiments, the docking station may utilize lookup tables to determine the operation of the fans of the docking station 610 that is required to cool the IHS within the default delay time. For instance, based on parameters such as current surface temperature of IHS and ambient temperature, lookup tables may be used to lookup the cooling fans of the docking station to be activated and the operating speed for each fan in order to provide the necessary cooling within the delay time.

As step 735, the docking station activates the auxiliary cooling sequence determined at step 730. For instance, in a scenario where a single fan of the docking station 610 is running when the release button 620 is pressed by the user, at step 730, the determined auxiliary cooling sequence may require increasing the fan to its maximum speed setting for the duration of the default delay. In certain embodiments, if at step 720, no auxiliary cooling sequence is available to cool the surface of the IHS before the expiration of the default delay, the docking station 610 may be configured to retain the docked IHS longer than default delay until safe handling temperatures have been confirmed. Such a condition may be indicated to the user, such as by a blinking or color-coded light that is provided by the docking station 610. Otherwise, if an auxiliary cooling sequence is identified that is sufficient to cool the docked IHS to a safe handling temperature within the default delay, such a sequence is implemented by the docking station at step 735. Once the auxiliary cooling sequence is completed, the default delay will have also expired and, at step 740, the IHS is released from the docking station.

* * *

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
    a cover enclosing a heatsink disposed over a planar surface of a processor; and
    a docking plate fixed to the cover, wherein:
        (a) the docking plate is positioned over the heatsink and forms an air gap between the docking plate and the heatsink;
        (b) the docking plate approaches the heatsink in a direction perpendicular to the planar surface of the processor, separately from a static portion of the cover surrounding the docking plate, and reduces the air gap, using one or more springs, in response to the IHS being docked into a docking station; and
        (c) the docking plate distances itself from the heatsink, independently from the static portion of the cover surrounding the docking plate, and increases the air gap, using the one or more springs, in response to the IHS being undocked from the docking station.

2. The IHS of claim 1, wherein the docking plate is thermally coupled to a heat conductive surface of the docking station integral to the docking station and inseparable therefrom in response to the IHS being docked into the docking station.

3. The IHS of claim 1, wherein the heatsink comprises one or more fins disposed in a direction perpendicular to the planar surface of the processor.

4. The IHS of claim 3, and wherein the air gap surrounds the fins.

5. The IHS of claim 1, wherein the docking plate includes one or more channels configured to accommodate the one or more fins when in response to the IHS being docked into the docking station.

6. The IHS of claim 1, wherein movement of the docking plate is spring-loaded with respect to the case, and restricts movement of the docking plate towards the heatsink during a docking operation.

7. The IHS of claim 1, wherein the docking station comprises a button that, in response to being pressed, allows the IHS to be undocked only after a time period greater than zero.

8. The IHS of claim 7, wherein the time period is determined, in part, based upon a temperature of the processor at the time of the pressing of the button.

* * * * *